(12) United States Patent
Yamamura

(10) Patent No.: US 8,274,742 B2
(45) Date of Patent: Sep. 25, 2012

(54) LENS ARRAY, LIGHT EMITTING DIODE HEAD, EXPOSURE DEVICE, IMAGE FORMING APPARATUS, AND IMAGE READING APPARATUS

(75) Inventor: Akihiro Yamamura, Tokyo (JP)

(73) Assignee: Oki Data Corporation, Tokyo (JP)

( * ) Notice: Subject to any disclaimer, the term of this patent is extended or adjusted under 35 U.S.C. 154(b) by 35 days.

(21) Appl. No.: 13/037,858

(22) Filed: Mar. 1, 2011

(65) Prior Publication Data

US 2011/0149404 A1 Jun. 23, 2011

Related U.S. Application Data

(62) Division of application No. 12/379,340, filed on Feb. 19, 2009, now Pat. No. 7,933,070.

(30) Foreign Application Priority Data

Mar. 18, 2008 (JP) ................................. 2008-069777

(51) Int. Cl.
*G02B 27/10* (2006.01)
(52) U.S. Cl. ........................................ 359/621; 359/740
(58) Field of Classification Search .......... 359/618–624, 359/738–740; 362/268
See application file for complete search history.

(56) References Cited

U.S. PATENT DOCUMENTS

| 2001/0033422 A1* | 10/2001 | Miura et al. ................ 359/621 |
| 2005/0151828 A1 | 7/2005 | Maeda | |

FOREIGN PATENT DOCUMENTS

| EP | 1887441 | 2/2008 |
|---|---|---|
| JP | 54-123948 | 9/1979 |
| JP | 62-297871 | 12/1987 |
| JP | 07-049476 | 2/1995 |
| JP | 10-062717 | 3/1998 |
| JP | 10-210213 | 8/1998 |
| JP | 2003-341134 | 12/2003 |
| JP | 2006-019918 | 1/2006 |
| JP | 2006-209057 | 8/2006 |
| JP | 2008-083576 | 4/2008 |
| JP | 2008-087185 | 4/2008 |
| JP | 2008-092006 | 4/2008 |

* cited by examiner

*Primary Examiner* — Joseph P Martinez
(74) *Attorney, Agent, or Firm* — Kubotera & Associates, LLC

(57) ABSTRACT

A lens array includes a plurality of lens assembly members with a plurality of lenses, a light blocking member with a plurality of apertures arranged therein, and a light blocking member including a plurality of apertures arranged therein. The lens assembly members are arranged so that an optical axis of each of the lenses of one of the lens assembly members is aligned with an optical axis of each of the lenses of another of the lens assembly members. Further, the lens assembly members and the light blocking member are arranged so that the following relationship is satisfied:

$$\frac{P}{2} \le RY\frac{LO-F}{F}$$

where P is a pitch of the lenses, F is a focal length of each of the lenses, LO is a distance between an object surface and each of the lenses, and RA is a distance between the optical axis and an inner surface of the aperture.

7 Claims, 14 Drawing Sheets

LENS ARRAY, LIGHT EMITTING DIODE HEAD, EXPOSURE DEVICE, IMAGE FORMING APPARATUS, AND IMAGE READING APPARATUS

CROSS-REFERENCE TO RELATED APPLICATIONS

This is a divisional application of a prior application Ser. No. 12/379,340, filed Feb. 19, 2009 now U.S. Pat. No. 7,933,070, allowed.

BACKGROUND OF THE INVENTION AND RELATED ART STATEMENT

The present invention relates to a lens array; a light emitting diode (LED) head including the lens array; an exposure device including the lens array; an image forming apparatus including the exposure device; and a reading apparatus including the lens array.

A conventional LED head is provided with a plurality of LEDs arranged therein, and is used for a conventional image forming apparatus of an electro-photography type such as a printer, a facsimile, and a copier. A conventional light receiving unit is provided with a plurality of light receiving elements, and is arranged therein is used for a conventional reading apparatus such as a scanner, a facsimile, and the likes. A conventional lens rod array is provided with a plurality of rod lenses arranged therein, and is used in the LED head, or in the light receiving unit for forming an image thereon (refer to Patent Reference).

Patent Reference: Japanese Patent Publication No. 2003-341134

In the conventional rod lens array, however, it is difficult to form an image with a high resolution.

In view of the problems described above, an object of the present invention is to provide a lens array capable of solving the problems of the conventional lens array. In the lens array of the present invention, a plurality of lenses is arranged in rows to form a lens assembly member. In the lens assembly member, the lenses with a specific focal length are arranged with a specific pitch in the rows with a specific pitch, thereby making it possible to form an image with a high resolution.

A further object of the present invention is to provide a light emitting diode (LED) head including the lens array; an exposure device including the lens array; an image forming apparatus including the exposure device; and a reading apparatus including the lens array.

Further objects and advantages of the invention will be apparent from the following description of the invention.

SUMMARY OF THE INVENTION

In order to attain the objects described above, according to the present invention, a lens array includes a plurality of lens assembly members and a light blocking member. Each of the lens assembly members includes a plurality of lenses arranged therein. The light blocking member includes a plurality of apertures arranged therein. The lens assembly members are arranged so that an optical axis of each of the lenses of one of the lens assembly members is aligned with an optical axis of each of the lenses of another of the lens assembly members. The light blocking member is arranged so that the optical axis of each of the lenses passes through each of the apertures. The lenses of each of the lens assembly members are arranged in a plurality of rows extending in a direction perpendicular to the optical axes.

Further, the lens assembly members and the light blocking member are arranged so that the following relationship is satisfied:

$$\sqrt{\left(\frac{PX}{2}\right)^2 + \left(\frac{PY}{4}\right)^2} \leq RA\frac{LO-F}{F}$$

where PY is a pitch of the lenses in one row, PX is a pitch of the rows, F is a focal length of each of the lenses, LO is a distance between each of the lenses and an object surface thereof, and RA is a maximum value of a distance between the optical axis and an inner surface of the aperture.

As described above, in the present invention, the lens array includes the lens assembly members and the light blocking member. The lens assembly members and the light blocking member are arranged so that the specific relationship is satisfied. Accordingly, it is possible to increase a resolution.

BRIEF DESCRIPTION OF THE DRAWINGS

FIGS. 13(a) to 13(c) are schematic views showing micro lenses of a lens array according to a fourth embodiment of the present invention, wherein FIG. 13(a) is a schematic plan view of the micro lenses, FIG. 13(b) is a schematic sectional view No. 1 of the micro lenses, and FIG. 13(c) is a schematic sectional view No. 2 of the micro lenses.

DETAILED DESCRIPTION OF PREFERRED EMBODIMENTS

Figure 1:
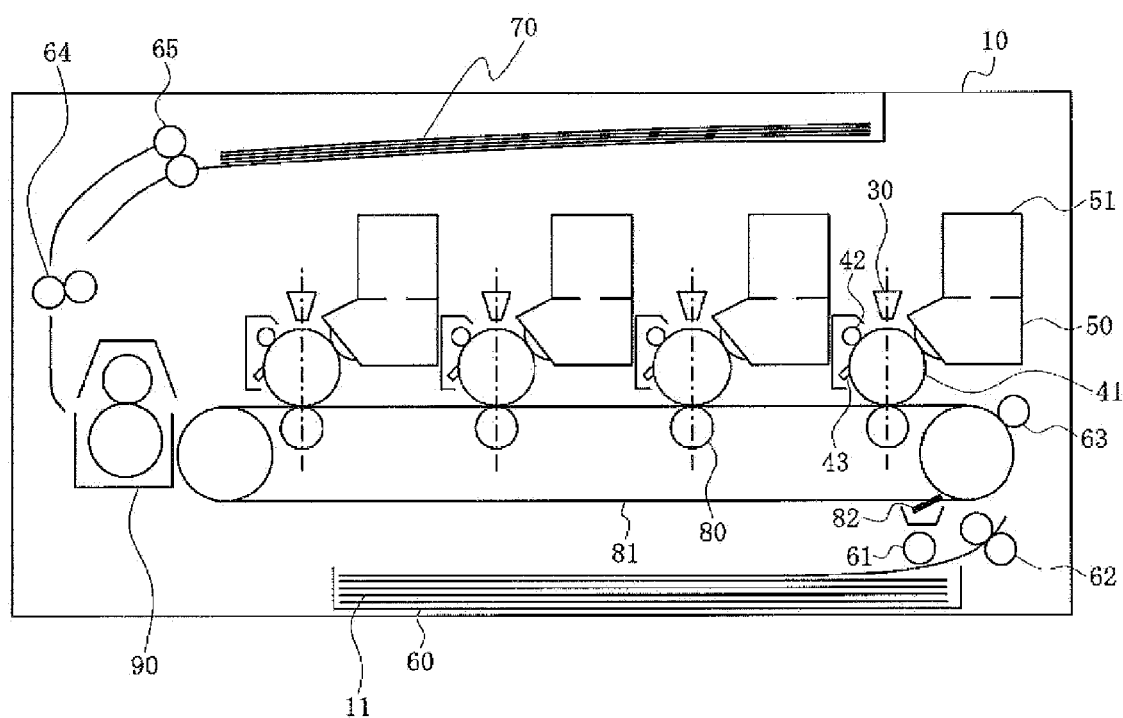
FIG. 1 is a schematic view showing a configuration of a printer according to a first embodiment of the present invention.

Hereunder, preferred embodiments of the present invention will be explained with reference to the accompanying drawings. Similar components in the drawings are designated with the same reference numerals.

First Embodiment

A first embodiment of the present invention will be explained. FIG. 1 is a schematic view showing a configuration of a printer 10 according to the first embodiment of the present invention. The printer 10 is a color printer of an electro-photography type as an image forming apparatus, and may be a monochrome printer. Further, the printer 10 may be a multi-function product having functions of a scanner, a facsimile, and a copier.

In the embodiment, the printer 10 forms an image on a sheet 11 as a printing medium according to image data using toner formed of a resin containing a colorant as a color agent. A sheet supply cassette 60 is disposed in the printer 10 for storing the sheet 11. Further, a sheet supply roller 61 is provided for picking up the sheet 11 from the sheet supply cassette 60, and transport rollers 62 and 63 are provided for transporting the sheet 11 picked up from the sheet supply cassette 60.

In the embodiment, the printer 10 is the color printer of the electro-photography type of a tandem type, and includes an image forming unit for forming a toner image in each color and a transfer unit for transferring the toner image formed with the image forming unit to the sheet 11.

In the embodiment, the image forming unit is arranged along a transport path of the sheet 11 in tandem, and includes four process units for forming images in colors of yellow, magenta, cyan, and black. Each of the process units has a photosensitive drum 41 as a static latent image supporting member; a developing device 50 for developing the static latent image formed on the photosensitive drum 41 to form the toner image; a toner cartridge 51 for supplying toner to the developing device 50; a charging roller 42 for supplying charges to a surface of the photosensitive drum 41 to charge; a cleaning blade 43 for removing toner remaining on the surface of the photosensitive drum 41; and an LED head 30 for selectively irradiating the surface of the photosensitive drum 41 according to image data to form the static latent image thereon. The toner image is a visible image of the static latent image using toner. The cleaning blade 41 is disposed to abut against the photosensitive drum 41 for scraping off toner after the toner image is transferred to the sheet 11.

In the embodiment, the transfer unit includes a transfer belt 81 for transporting the sheet 11, and a transfer roller 80 for transferring the toner image formed on the photosensitive drum 41 to the sheet 11. The transfer roller 80 is disposed to face the photosensitive drum 41 with the transfer belt 81 in between in each of the process units. A cleaning blade 82 is disposed to abut against the transfer belt 81 for scraping off toner attached to the transfer belt 81.

In the embodiment, a fixing device 90 is disposed on a downstream side of the image forming unit in a direction that the sheet 11 is transported for fixing the toner image transferred to the sheet 11 through heat and pressure. A transport roller 64 is provided for transporting the sheet 11, and a discharge roller 65 is provided for discharging the sheet 11 to a discharge unit 70 for storing the sheet 11 therein.

In the embodiment, a power source (not shown) applies a specific voltage to the charging roller 42 and the transfer roller 80. A motor (not shown) and a gear (not shown) drive the transfer belt 81, the photosensitive drum 41, and each roller to rotate. A power source (not shown) and a control unit (not shown) are connected to the developing device 50, the LED head 30, the fixing device 90, and each motor (not shown).

In the embodiment, the printer 10 further includes an external interface (not shown) connected to a network (not shown) to communicate with an external device for receiving print data from a host device, and a control unit for receiving the print data from the external interface and controlling an entire operation of the printer 10.

Figure 2:
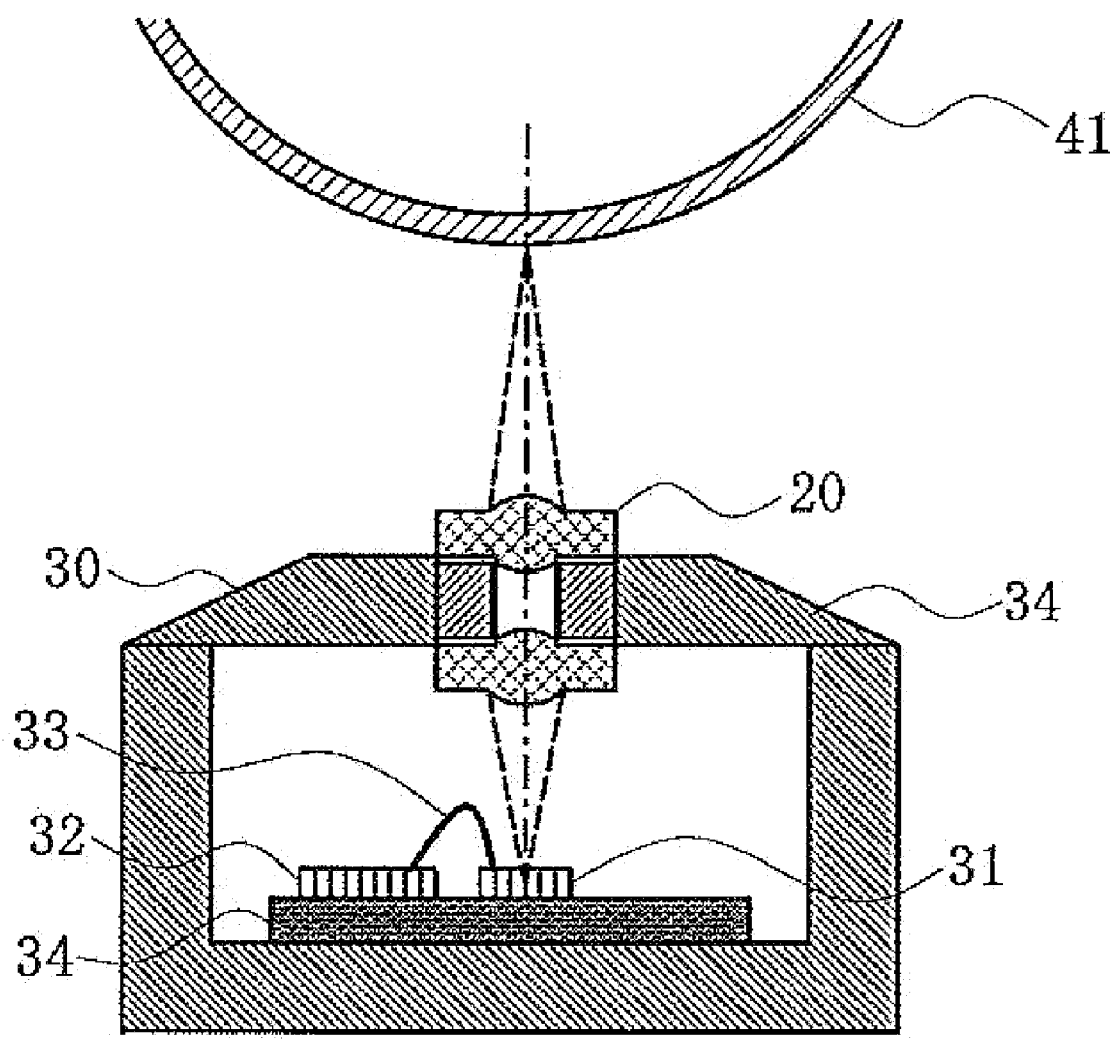
FIG. 2 is a schematic sectional view showing an LED (Light Emitting Diode) head according to the first embodiment of the present invention.

A configuration of the LED head 30 will be explained next. FIG. 2 is a schematic sectional view showing the LED (Light Emitting Diode) head 30 according to the first embodiment of the present invention.

As shown in FIG. 2, the LED head 30 is provided with a lens array 20. The lens array 20 is fixed to the LED head 30 with a holder 34. The LED head 30 further includes an LED element 31, a driver IC 32 for controlling the LED element 31 to emit light. The LED element 31 and the driver IC 32 are mounted on a circuit board 34, and are connected through a wiring portion 33. When light emitted from the LED element 31 passes through the lens array 20, a focused image is formed on the surface of the photosensitive drum 41.

In the embodiment, the LED head 30 has a resolution of 600 dpi, and 600 of the LED elements 31 are arranged in one inch. That is, the LED elements 31 are arranged with an interval of 0.0423 mm, thereby forming an LED array.

Figure 3A:
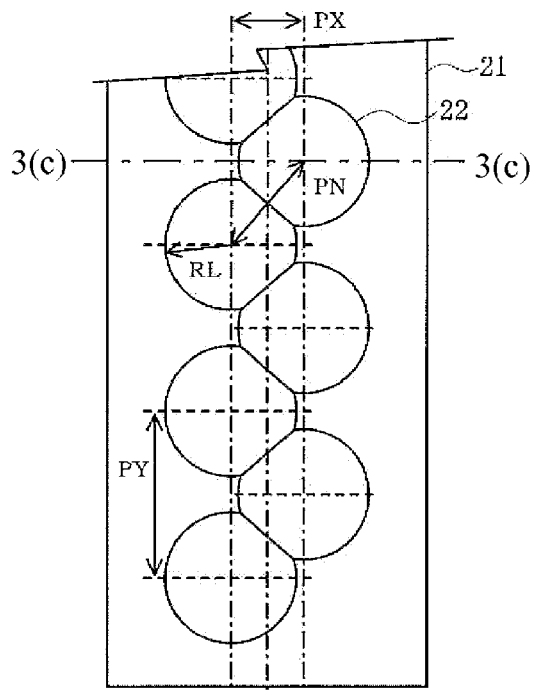
FIGS. 3(*a*) to 3(*d*) are schematic views showing a lens array according to the first embodiment of the present invention, wherein FIG. 3(*a*) is a plan view of the lens array, FIG. 3(*b*) is a plan view of a light blocking member, FIG. 3(*c*) is a sectional view table along a line 3(*c*)-3(*c*) in FIG. 3(*a*), and FIG. 3(*d*) is an enlarged view of the light blocking member.
Figure 3B:
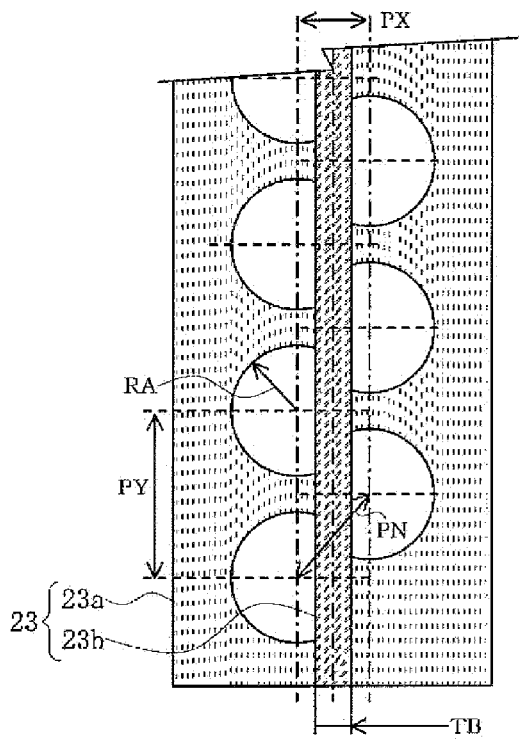
Figure 3C:
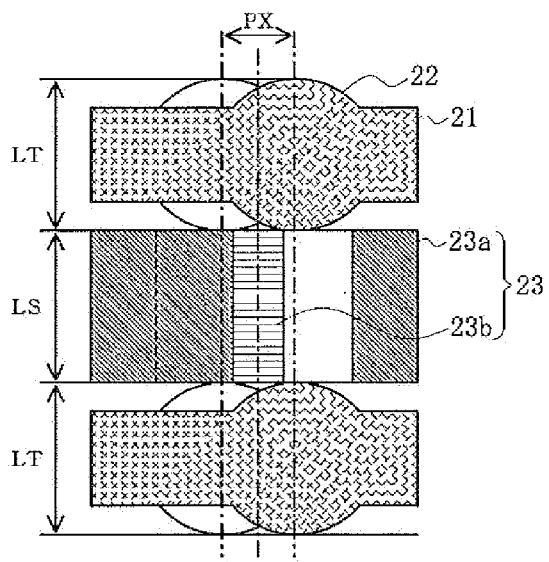
Figure 3D:
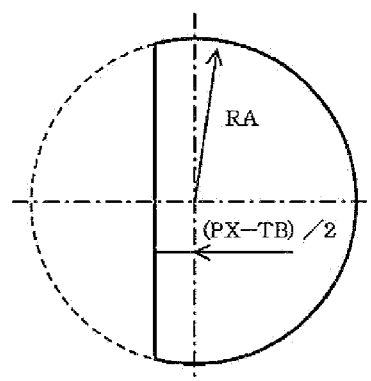

A configuration of the lens array 20 will be explained next. FIGS. 3(a) to 3(d) are schematic views showing the lens array 20 according to the first embodiment of the present invention. More specifically, FIG. 3(a) is a plan view of the lens array 20, FIG. 3(b) is a plan view of a light blocking member 23, FIG. 3(c) is a sectional view table along a line 3(c)-3(c) in FIG. 3(a), and FIG. 3(d) is an enlarged view of the light blocking member 23.

As shown in FIG. 3(c), the lens array 20 includes lens plates 21 as a lens assembly and the light blocking member 23. The lens plate 21 has a plurality of micro lenses 22 as lenses, and is formed of a material transparent to light emitted from the LED element 31. Two of the lens plates 21 sandwich the light blocking member 23 in parallel with each other, so that optical axes of corresponding micro lenses 22 are aligned with each other. The axes of the micro lenses 22 extend in a direction perpendicular to a plane surface of the lens plate 21. Further, the lens plate 21 has a thickness LT at a maximum thickness of the micro lenses 22.

In the embodiment, each of the lens plates 21 has the micro lenses 22 arranged in two rows. In each row, the micro lenses 22 are arranged with a pitch PY, that is, the adjacent micro lenses 22 are arranged such that centers thereof are separated by the pitch PY. The rows are separated by a pitch PX, that is, centerlines of the rows are separated by the pitch PX. Note that, in FIG. 3(a), the micro lenses 22 are arranged in the rows in a vertical direction.

In the embodiment, in the adjacent rows, the micro lenses 22 are shifted with each other. As shown in FIG. 3(a), in a plan view of the lens plate 21, the micro lenses 22 are arranged in the two rows alternately or in a zigzag pattern as a whole. Further, each of the micro lenses 22 is closely arranged to overlap with the micro lenses 22 in the adjacent row on both sides thereof.

In the embodiment, each of the micro lenses 22 has a circular shape with a radius RL in a plane view except portions thereof overlapping with the micro lenses 22 in the adjacent row on both sides thereof. More specifically, in each of the micro lenses 22, a maximum distance between the optical axis to an outer circumference is equal to the radius RL, and a center of each of the micro lenses 22 is apart by a distance PN from centers of the micro lenses 22 in the adjacent row on both sides thereof. That is, the optical axis of each of the micro lenses 22 is apart by the distance PN from the optical axis of each of the micro lenses 22 in the adjacent row. Each of the micro lenses 22 is closely arranged to overlap with the micro lenses 22 in the adjacent row on both sides thereof, so that double of the radius RL is greater than the distance PN (2RL>PN).

As shown in FIG. 3(b), the light blocking member 23 is a plate member with a band shape extending in a vertical direction. The light blocking member 23 includes two comb shape members 23a having a plurality of opening portions as apertures opening one side edge thereof, and a section plate 23b disposed between the comb shape members 23a and extending in the vertical direction.

In the embodiment, the comb shape members 23a are arranged such that the side edges thereof with the opening portions face with each other. The section plate 23b has a width TB, and both side edges thereof abut against the side edges of the comb shape members 23a facing with each other. Accordingly, as shown in FIG. 3(c), the light blocking member 23 has a rectangular shape as a whole similar to that of the lens plate 21, and is formed of a single plate member with a thickness LS. The comb shape members 23a and the section plate 23b are formed of a material blocking light emitted from the LED element 31.

As shown in FIGS. 3(b) and 3(d), each of the opening portions has a circular shape with a radius RA in a plane view partially cut with a straight line corresponding to the side edges of the comb shape members 23a. Further, the opening portions of each of the comb shape members 23a are arranged in one row extending in the vertical direction. That is, the light blocking member 23 has the opening portions arranged in two rows.

In the embodiment, in each row, the opening portions are arranged with the pitch PY, that is, the adjacent opening portions are arranged such that centers thereof are separated by the pitch PY. The rows are separated by a pitch PX, that is, centerlines of the rows are separated by the pitch PX. The opening portions pass through the light blocking member 23 in a thickness direction thereof for passing light therethrough in a direction perpendicular to a plane surface of the lens plate 21.

In the embodiment, in the adjacent rows, similar to the micro lenses 22, the opening portions are shifted with each other by a half pitch. As shown in FIG. 3(c), in a plan view of the light blocking member 23, the opening portions are arranged in the two rows alternately or in a zigzag pattern as a whole.

As shown in FIG. 3(c), when the lens plate 21 sandwich the light blocking member 23, the opening portions are aligned with the micro lenses 22. More specifically, the optical axis of each of the micro lenses 22, that is, the axis passing through the circular center of each of the micro lenses 22 in a plan view in a thickness direction thereof, is aligned with an axis passing through a circular center of each of the opening portions in a plan view in a thickness direction thereof. Accordingly, the circular center of each of the opening portions is separated from the circular centers of the opening portions in the adjacent row by the distance PN.

As shown in FIG. 3(d), each of the opening portions has the circular shape in a plan view having a half-circular portion and a portion of the half-circular portion cut with the straight line corresponding to the side edges of the comb shape members 23a. The portion has a width of (PX−TB)/2. That is, the circular center of each of the opening portions is separated by a distance of (PX−TB)/2 from the straight line corresponding to the side edges of the comb shape members 23a.

Figure 4:
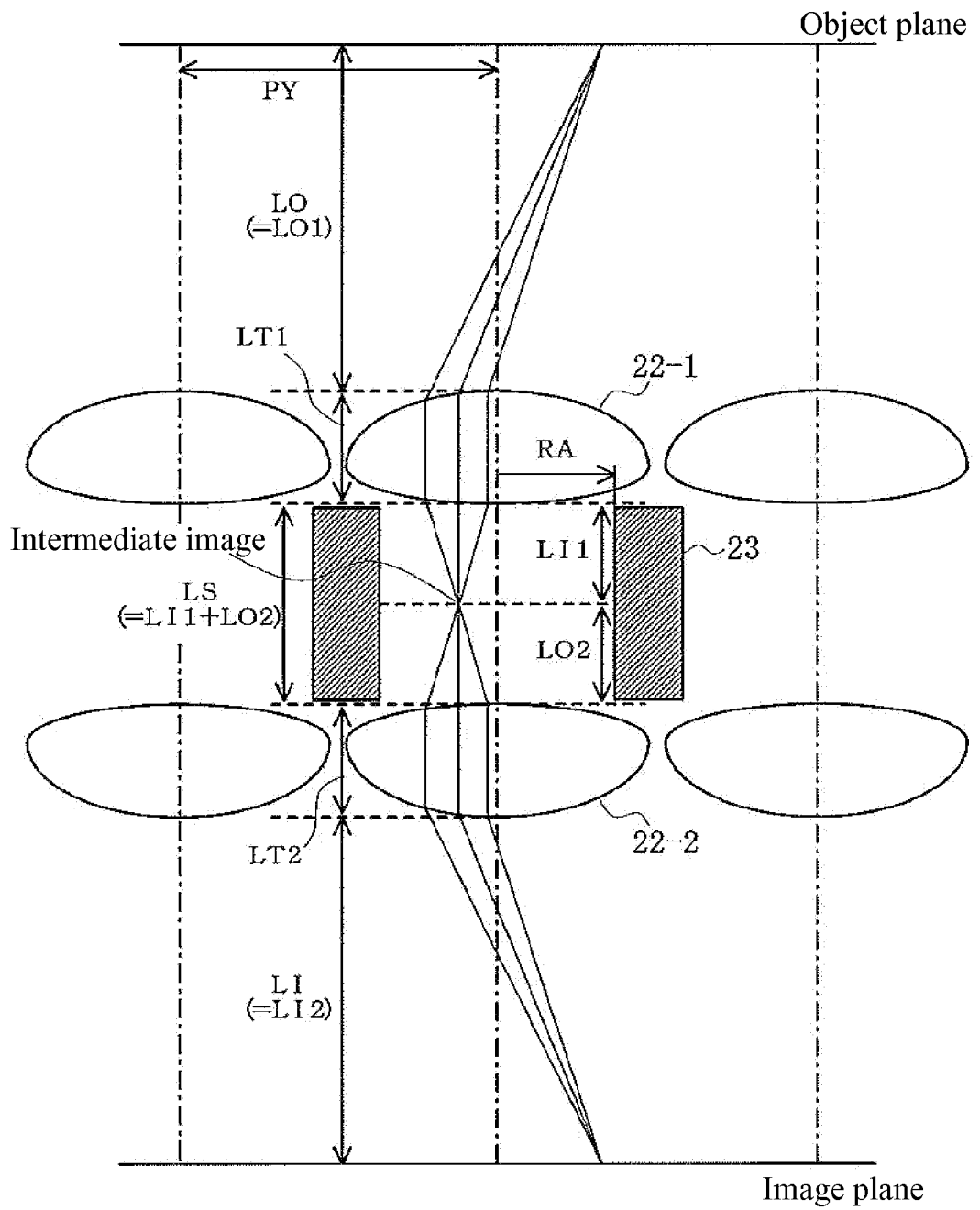
FIG. 4 is a schematic sectional view No. 1 showing the lens array taken along a plane including optical axes of micro lenses in parallel to a direction that the micro lenses are arranged according to the first embodiment of the present invention.

The configuration of the lens array 20 will be explained in more detail next. FIG. 4 is a schematic sectional view No. 1 showing the lens array 20 taken along a plane including the optical axes of the micro lenses 22 in parallel to a direction that the micro lenses 22 are arranged according to the first embodiment of the present invention. Note that a left-to-right direction in FIG. 4 is in parallel to the direction that the micro lenses 22 are arranged.

As shown in FIG. 4, a first micro lens 22-1 is arranged at a position away from an object plane of the lens array 20 (a light emitting surface of the LED element 31) by a distance LO. A second micro lens 22-2 is arranged away from the micro lens 22-1 by a distance LS, such that an optical axis thereof is aligned with an optical axis of the micro lens 22-1. An image plane (a surface of the photosensitive drum 41) of the lens array 20 is situated at a position away from the micro lens 22-2 in an optical axis direction by a distance LI.

In the embodiment, the first micro lens 22-1 has a thickness LT1 and a front focal length FO, so that the first micro lens 22-1 forms an image of an object at a distance LO1 on a plane at a distance LI1 in the optical axis direction. Further, the second micro lens 22-2 has a rear focal length FI, so that the second micro lens 22-2 forms an image of an object at a distance LO2 on a plane at a distance LI2 in the optical axis direction.

In the embodiment, the first micro lens 22-1 is arranged such that the distance LO from the object plane of the lens array 20 is equal to the distance LO1. Further, the first micro lens 22-1 and the second micro lens 22-2 are arranged such that a distance LS therebetween is equal to a sum of LI1 and LO2 (LS=LI1+LO2). Further, the second micro lens 22-2 is arranged such that the distance LI to the image plane of the lens array 20 is equal to the distance LI2.

In the embodiment, the first micro lens 22-1 may have a configuration the same as that of the second micro lens 22-2. In this case, the first micro lens 22-1 and the second micro lens 22-2 have the thickness LT1 and the front focal length FO.

When an image of an object at the distance LO1 in the optical axis direction is formed on a plane at the distance LI1 in the optical axis direction, the first micro lens 22-1 is arranged such that the distance LO from the object plane of the lens array 20 is equal to the distance LO1. Further, the first micro lens 22-1 and the second micro lens 22-2 are arranged such that the distance LS therebetween is equal to double of LI1 (LS=2×LI1). The second micro lens 22-2 is arranged such that a curved surface thereof facing the image plane has a shape the same as that of the first micro lens 22-1 facing the object plane. Further, the second micro lens 22-2 is arranged such that the distance LI to the image plane of the lens array 20 is equal to the distance LO1 (LI=LO1).

In the embodiment, the lens plate 21 of the lens array 20 may be formed of an optical resin of a cyclo-olefin type (ZEONEX E48R, a product of Zeon Corporation). It is possible to form a plurality of the micro lenses 22 using the optical resin through an injection molding. Further, the light blocking member 23 is formed of polycarbonate, and is formed through a resin molding.

In the embodiment, each of the micro lenses 22 has a rotationally symmetrical high order aspheric surface expressed with the equation (1).

$$z(r) = \frac{\frac{r^2}{C}}{1 + \sqrt{1 - \left(\frac{r}{C}\right)^2}} + Ar^4 + Br^6 \quad (1)$$

where C is a curvature radius, A is a fourth order aspheric surface coefficient, and B is a sixth order aspheric surface coefficient. In the equation (1), the function z(r) represents a rotational coordinate with a radial coordinate r, in which an axis thereof extends in parallel to the optical axes of the micro lenses 22. In the rotational coordinate, an origin is located at a top of a curved surface of each of the micro lenses 22, and a positive number is assigned in a direction from the object plane of the lens array 20 toward the image plane thereof.

An operation of the printer 10 will be explained next. As shown in FIG. 1, the power source (not shown) applies a voltage to the charging roller 42, so that the charging roller 42 charges the surface of the photosensitive drum 41. When the photosensitive drum 41 rotates, and the surface of the photosensitive drum 41 thus charged approaches the LED head 30, the LED head 30 exposes the surface of the photosensitive drum 41, thereby forming the static latent image thereon. Then, the developing device 50 develops the static latent image, thereby forming the toner image on the surface of the photosensitive drum 41.

When the sheet supply roller 61 picks up the sheet 11 set in the sheet supply cassette 60, the transport rollers 62 and 63 transports the sheet 11 to the transfer roller 80 and the transfer belt 81. When the photosensitive drum 41 rotates, and the toner image on the surface of the photosensitive drum 41 approaches the transfer roller 80 and the transfer belt 81, the transfer roller 80 and the transfer belt 81 with a voltage applied from the power source (not shown) transfer the toner image on the surface of the photosensitive drum 41 to the sheet 11.

After the toner image is transferred to the sheet 11, the transfer belt 81 rotates to transport the sheet 11 to the fixing device 90, so that the fixing device 90 presses and heats the toner image on the sheet 11, thereby fixing the toner image to the sheet 11. Then, the transport roller 64 and the discharge roller 65 discharge the sheet 11 to the discharge unit 70, thereby completing the operation of the printer 10.

An operation of the LED head 30 will be explained next. When the control unit of the printer 10 sends a control signal of the LED head 30 according to the print data thus received, the LED element 31 emits light with a specific amount according to a control signal of the driver IC 32 shown in FIG. 2. When the LED element 31 emits light, light passes through the lens array 20, thereby forming an image on the photosensitive drum 41.

An operation of the lens array 20 will be explained next. As shown in FIG. 4, when light emitted from the LED element 31 passes through the first micro lens 22-1, the first micro lens 22-1 forms an intermediate image at the position at the distance LI1 in the optical axis direction. Then, the second micro lens 22-2 forms an intermediate image, so that an image of the LED element 31 is formed on the image plane. The intermediate image is an inverted reduced image of the LED element 31, and the image of the LED element 31 on the image plane is an inverted enlarged image formed with the second micro lens 22-2. Note that a chief ray of light from each point on the object plane is parallel with each other between the second micro lens 22-2 and the second micro lens 22-2, i.e., telecentric.

As described above, the lens array 20 forms an erecting same size image of the LED element 31. Note that the light blocking member 23 blocks light from the LED element 31 not forming the image.

Similarly, when the second micro lens 22-2 and the second micro lens 22-2 have the same configuration, the lens array 20 forms an erecting same size image of the LED element 31. That is, when light emitted from the LED element 31 passes through the first micro lens 22-1, the first micro lens 22-1 forms an intermediate image at the position at a distance LS/2 in the optical axis direction. Then, the second micro lens 22-2 forms an intermediate image, so that an image of the LED element 31 is formed on the image plane. A chief ray of light is telecentric between the second micro lens 22-2 and the second micro lens 22-2.

Figure 5:
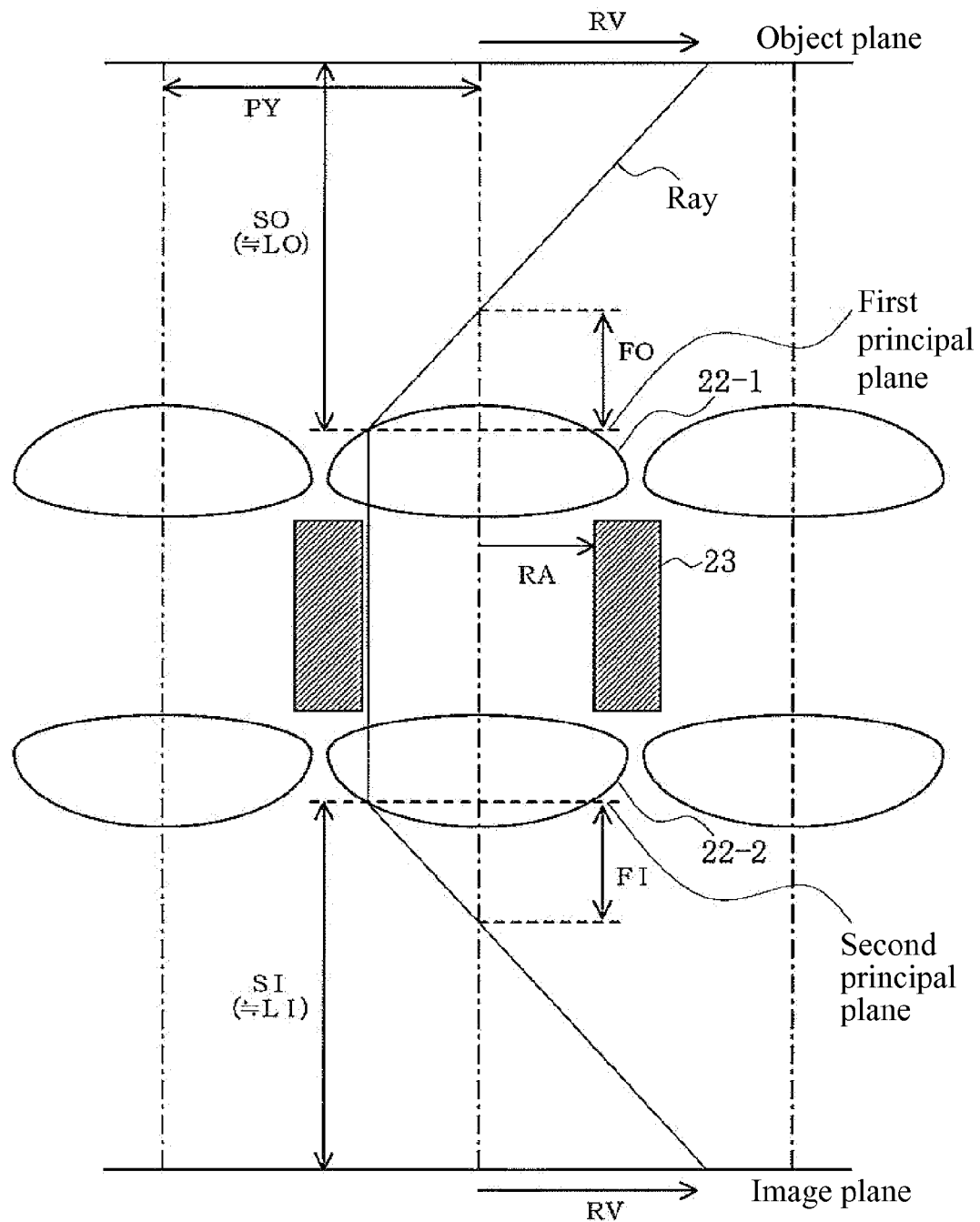
FIG. 5 is a schematic sectional view No. 2 showing the lens array taken along the plane including the optical axes of the micro lenses in parallel to the direction that the micro lenses are arranged according to the first embodiment of the present invention.

An optical property of the micro lenses 22 will be explained next. FIG. 5 is a schematic sectional view No. 2 showing the lens array 20 taken along the plane including the optical axes of the micro lenses 22 in parallel to the direction that the micro lenses 22 are arranged according to the first embodiment of the present invention.

As shown in FIG. 5, the first micro lens 22-1 has the front focal length FO, and a first principal plane of the first micro lens 22-1 is away from the object plane by a distance SO. Further, the second micro lens 22-2 has the rear focal length FI, and a second principal plane of the second micro lens 22-2 is away from the image plane by a distance SI.

In the embodiment, a difference between the distance SO and the distance LO is inversely proportional to a curvature radius of a curved surface of the first micro lens 22-1 facing the object plane. Further, a difference between the distance SI and the distance LI is inversely proportional to a curvature radius of a curved surface of the second micro lens 22-2 facing the image plane. In the lens array 20, the first micro lens 22-1 and the second micro lens 22-2 have a large curvature radius, and the difference between the distance SO and the distance LO and the difference between the distance SI and the distance LI are negligible. Accordingly, the distance SO is substantially equal to the distance LO (SO≈LO), and the distance SI is substantially equal to the distance LI (SI≈LI).

As described above, the chief ray of light from each point on the object plane is parallel with each other between the second micro lens 22-2 and the second micro lens 22-2. In particular, the light blocking member 23 blocks surrounding rays of light passing near an inner wall of the opening portion of the light blocking member 23 (refer to FIG. 5). Further, there is a homologous relationship among a ray shown in FIG. 5, the object plane, and the first principal plane of the first micro lens 22-1. Accordingly, a field of view radius RV of the first micro lens 22-1 is expressed with the following equation (2):

$$RV = RA\frac{LO - FO}{FO} \quad (2)$$

Figure 6C:
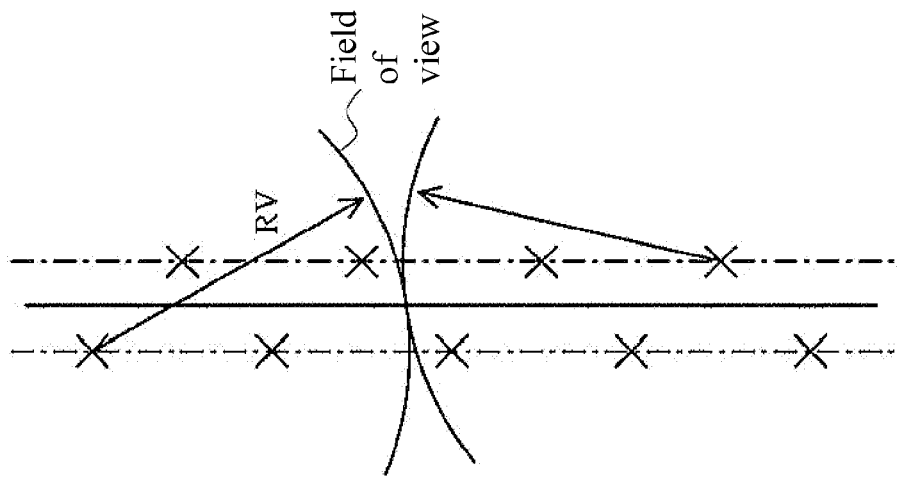
FIGS. 6(*a*) to 6(*c*) are schematic views showing the lens array in which the micro lenses are arranged in two rows according to the first embodiment of the present invention.
Figure 6B:
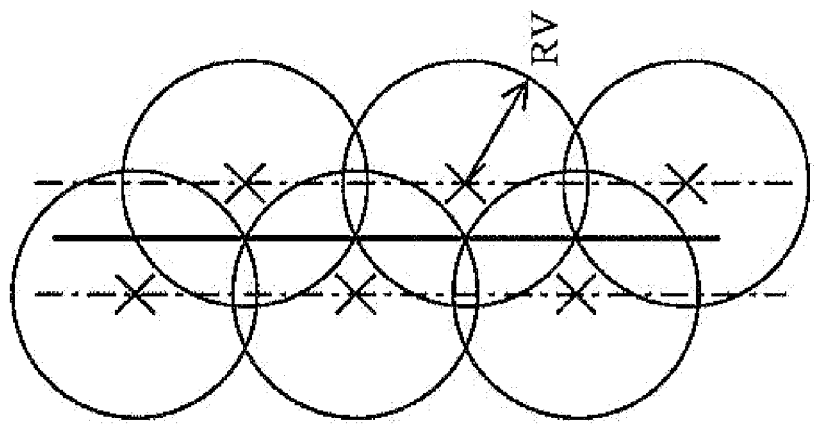
Figure 6A:
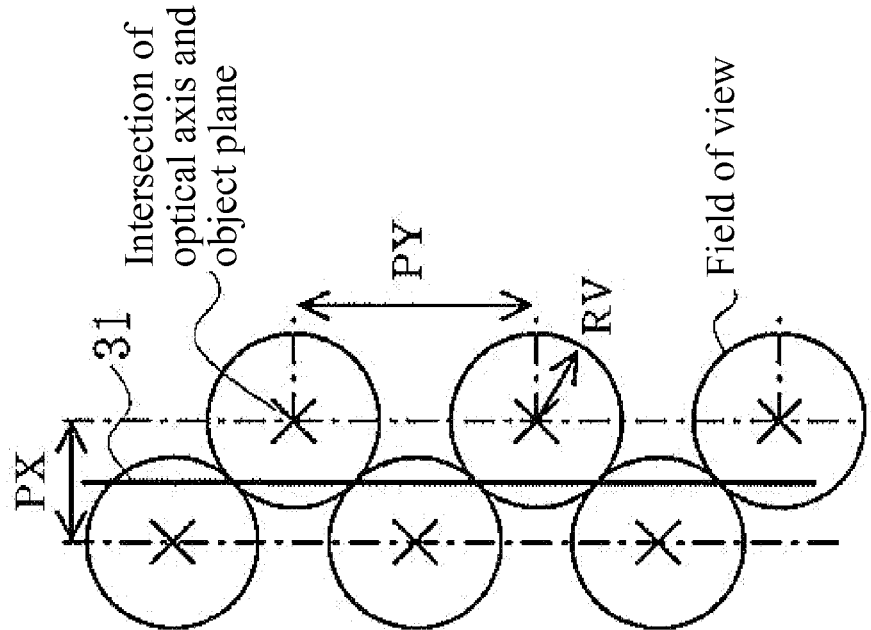

A relationship between an arrangement of the micro lenses 22 and the field of view radius RV when the micro lenses 22 are arranged in two rows will be explained next. FIGS. 6(a) to 6(c) are schematic views showing the lens array 20 in which the micro lenses 22 are arranged in two rows according to the first embodiment of the present invention. More specifically, FIG. 6(a) is a view showing a relationship between the micro lenses 22 and the LED elements 31 when all of the LED elements 31 are situated in a field of view of at least one micro lens 22; FIG. 6(b) is a view showing a relationship between the micro lenses 22 and the LED elements 31 when all of the LED elements 31 are situated in fields of views of two micro lenses 22; and FIG. 6(c) is a view showing a relationship between the micro lenses 22 and the LED elements 31 when all of the LED elements 31 are situated in fields of views of eight micro lenses 22.

FIG. 6(a) is the view showing a condition of the field of view radius RV at a smallest level when all of the LED elements 31 are situated in the field of view of at least one micro lens 22, and images of all of the LED elements 31 are formed on the photosensitive drum 41. That is, under the condition, the field of view radius RV is at the smallest level for the micro lenses 22 to be operable. At the condition, the field of view radius RV of the first micro lens 22-1 is expressed with the following equation (3):

$$RV = \sqrt{\left(\frac{PX}{2}\right)^2 + \left(\frac{PY}{4}\right)^2} \quad (3)$$

where PY is an interval between the micro lenses 22 in the arrangement direction, that is, the pitch of the micro lenses 22 in each row, and PX is an interval between the micro lenses 22 in a direction perpendicular to the arrangement direction, that is, the pitch of the rows.

From the equations (2) and (3), the following equation (4) is obtained as a condition for the lens array 20 to be operable:

$$\sqrt{\left(\frac{PX}{2}\right)^2 + \left(\frac{PY}{4}\right)^2} \leq RA\frac{LO-F}{F} \quad (4)$$

where F is the focal length of the micro lenses 22, LO is the distance between the lens array 20 and the object plane of the lens array 20, and RA is a maximum value of the distance between the optical axis of the micro lens 22 and the inner wall of the opening portion of the light blocking member 23.

When one micro lens 22 forms an image of each of the LED elements 31, an image of the LED element 31 near the optical axis of the micro lens 22 is different from that of the LED element far from the optical axis of the micro lens 22. Accordingly, it is configured such that at least two of the micro lenses 22 form an image of each of the LED elements 31, thereby making it possible to form images of all of the LED elements 31 in a same shape.

FIG. 6(b) is the view showing a condition for all of the LED elements 31 to be situated in the fields of views of two micro lenses 22. At the condition, the field of view radius RV is expressed with the following equation (5):

$$RV = \sqrt{\left(\frac{PX}{2}\right)^2 + \left(\frac{PY}{2}\right)^2} \quad (5)$$

where PY is the interval between the micro lenses 22 in the arrangement direction, and PX is the interval between the micro lenses 22 in the direction perpendicular to the arrangement direction.

When an object is situated far from the optical axis of the micro lens 22, the micro lens 22 tends to form a distorted image. When the field of view radius RV increases, the micro lens 22 tends to form a distorted image to a larger extent due to a distance of the object from the optical axis thereof. When the LED element 31 is situated in the fields of views of more than eight micro lenses 22, it is found that a resolution is significantly lowered due to the distortion of the image caused by a distance of the object from the optical axis.

FIG. 6(c) is the view showing a condition for all of the LED elements 31 to be situated in the fields of views of more than eight micro lenses 22. At the condition, the field of view radius RV is expressed with the following equation (6):

$$RV = \sqrt{\left(\frac{PX}{2}\right)^2 + \left(\frac{7}{4}PY\right)^2} \quad (6)$$

where PY is the interval between the micro lenses 22 in the arrangement direction, and PX is the interval between the micro lenses 22 in the direction perpendicular to the arrangement direction.

From the equations (2), (5), and (6), the following equation (7) is obtained as a condition for the lens array 20 to have a high resolution:

$$\sqrt{\left(\frac{PX}{2}\right)^2 + \left(\frac{PY}{2}\right)^2} \leq RA\frac{LO-F}{F} < \sqrt{\left(\frac{PX}{2}\right)^2 + \left(\frac{7}{4}PY\right)^2} \quad (7)$$

where F is the focal length of the micro lenses 22, LO is the distance between the lens array 20 and the object plane of the lens array 20, and RA is the maximum value of the distance between the optical axis of the micro lens 22 and the inner wall of the opening portion of the light blocking member 23.

Figure 7B:
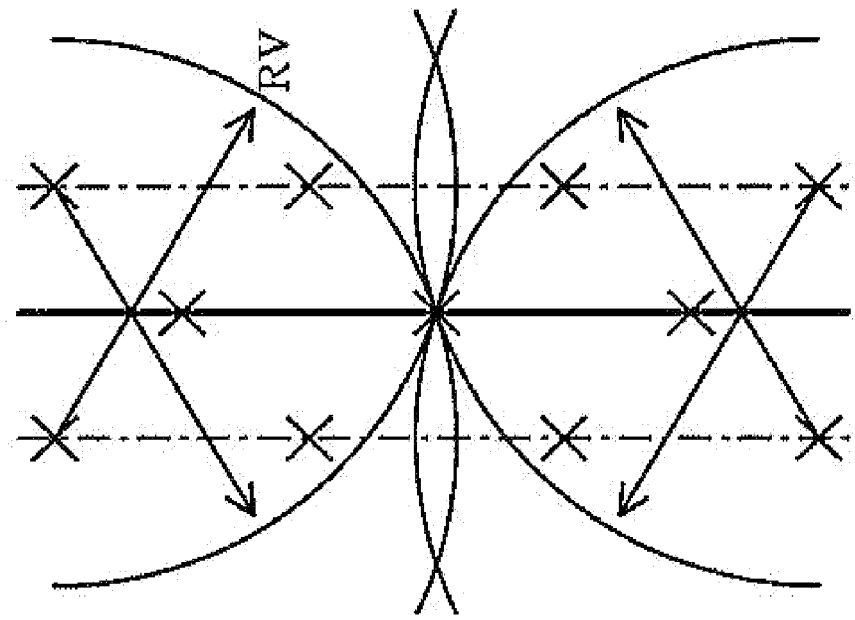
FIGS. 7(*a*) and 7(*b*) are schematic views showing the lens array in which the micro lenses are arranged in three rows according to the first embodiment of the present invention.
Figure 7A:
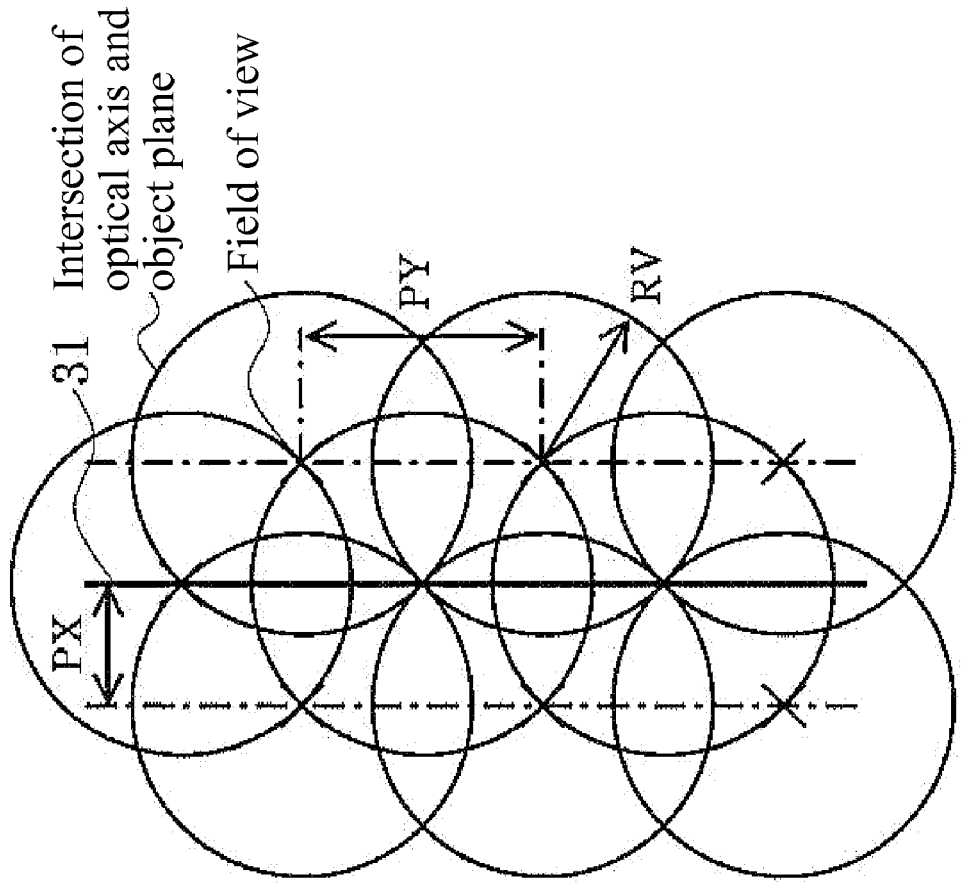

A relationship between an arrangement of the micro lenses 22 and the field of view radius RV when the micro lenses 22 are arranged in three rows will be explained next. FIGS. 7(a) and 7(b) are schematic views showing the lens array 20 in which the micro lenses 22 are arranged in the three rows according to the first embodiment of the present invention. More specifically, FIG. 7(a) is a view showing a relationship between the micro lenses 22 and the LED elements 31 when all of the LED elements 31 are situated in fields of views of two micro lenses 22; and FIG. 7(b) is a view showing a relationship between the micro lenses 22 and the LED elements 31 when all of the LED elements 31 are situated in fields of views of more than eight micro lenses 22.

FIG. 6(b) is the view showing a condition for all of the LED elements 31 to be situated in the fields of views of two micro lenses 22. When it is configured such that at least two of the micro lenses 22 form an image of each of the LED elements 31, it is possible to form images of all of the LED elements 31 in a same shape. At the condition, the field of view radius RV is expressed with the following equation (8):

$$RV = \sqrt{(PX)^2 + \left(\frac{PY}{2}\right)^2} \tag{8}$$

where PY is the interval between the micro lenses 22 in the arrangement direction, and PX is the interval between the micro lenses 22 in the direction perpendicular to the arrangement direction.

When the LED element 31 is situated in the fields of views of more than eight micro lenses 22, it is found that a resolution is significantly lowered due to the distortion of the image caused by a distance of the object from the optical axis. FIG. 7(b) is the view showing a condition for all of the LED elements 31 to be situated in the fields of views of more than eight micro lenses 22. At the condition, the field of view radius RV is expressed with the following equation (9):

$$RV = \sqrt{(PX)^2 + \left(\frac{3}{2}PY\right)^2} \tag{9}$$

where PY is the interval between the micro lenses 22 in the arrangement direction, and PX is the interval between the micro lenses 22 in the direction perpendicular to the arrangement direction.

From the equations (2), (8), and (9), the following equation (10) is obtained as a condition for the lens array 20 to have a high resolution:

$$\sqrt{(PX)^2 + \left(\frac{PY}{2}\right)^2} \leq RA\frac{LO-F}{F} < \sqrt{(PX)^2 + \left(\frac{3}{2}PY\right)^2} \tag{10}$$

where F is the focal length of the micro lenses 22, LO is the distance between the lens array 20 and the object plane of the lens array 20, and RA is the maximum value of the distance between the optical axis of the micro lens 22 and the inner wall of the opening portion of the light blocking member 23.

Figure 8:
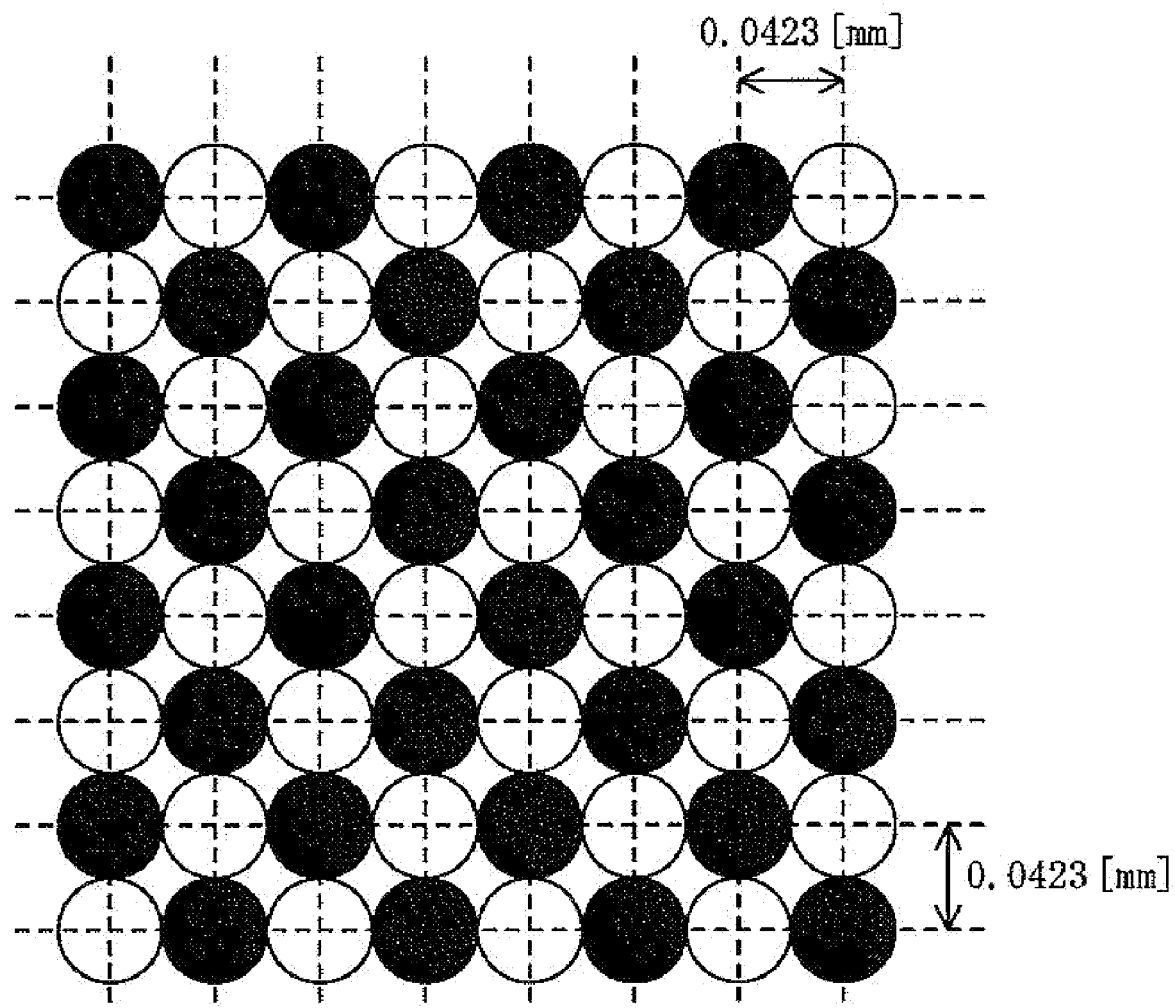
FIG. 8 is a schematic view showing an image used for evaluating the lens array according to the first embodiment of the present invention.

An evaluation of the printer 10 with the lens array 20 will be explained next. FIG. 8 is a schematic view showing an image used for evaluating the lens array 20 according to the first embodiment of the present invention.

In the evaluation, a color LED printer having a configuration the same as that of the printer 10 is used, and the color LED printer includes the lens array 20 described above. The color LED printer forms the image having a pattern of dots alternately arranged over an entire printable area. As shown in FIG. 8, it is possible to obtain the image with high quality without a streak or an uneven spot.

As described above, in the embodiment, the micro lenses 22 are integrally formed on the lens plate 21, and each of the micro lenses 22 may be separately formed and arranged with a specific interval. Further, in the lens array 20, the micro lenses 22 are arranged in two or three rows, and may be arranged in more than four rows.

In the embodiment, each of the micro lenses 22 has the rotationally symmetrical high order aspheric surface, and may have a curved surface such as a spherical surface, an anamorphic aspheric surface, a parabolic surface, an oval surface, a hyperbolic surface, a Korenich surface, and the likes.

In the embodiment, the lens plate 21 is molded with a metal mold, and may be formed with a resin mold, or through machining. Further, the lens plate 21 is formed of a resin, and may be formed of glass.

In the embodiment, a plurality of the LED elements 31 as the light emitting members is arranged to form the LED array, and the LED array may be formed of an organic EL (Electro Luminescence), a semiconductor laser, and a combination of a light emitting member such as a fluorescent lamp and a halogen lamp, and a shutter formed of a liquid crystal element.

As described above, in the embodiment, a plurality of the micro lenses 22 is arranged to form the lens array 20. Accordingly, as opposed to a lens array with a plurality of rod lenses, it is possible to increase a resolution. Further, the micro lenses 22 are arranged in the specific pattern, thereby further increasing a resolution. When the LED head 30 includes the lens array 20 described above, it is possible to obtain a sufficient exposure amount and high contrast. When the printer 10 includes the LED head 30, it is possible to accurately form an image on the sheet 11 according to print data without a streak or an uneven spot, thereby improving image quality.

Second Embodiment

A second embodiment of the present invention will be explained next. Components in the second embodiment similar to those in the first embodiment are designated with the same reference numerals, and explanations thereof are omitted. Explanations of effects and operations in the second embodiments similar to the first embodiment are omitted.

Figure 9A:
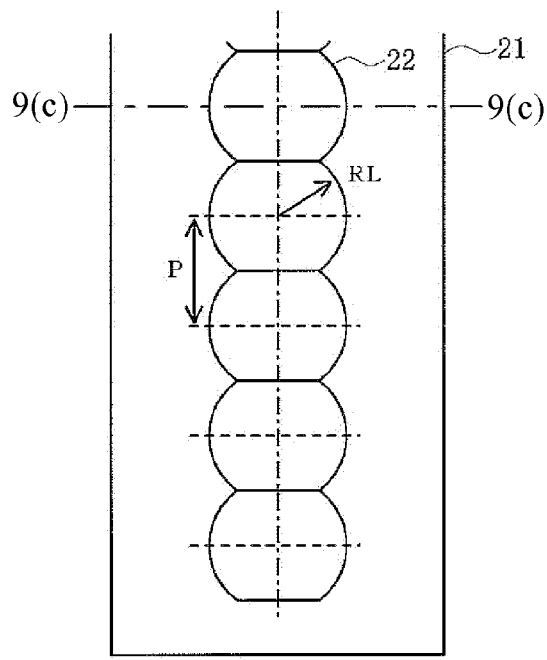
FIGS. 9(*a*) to 9(*c*) are schematic views showing a lens array according to a second embodiment of the present invention, wherein FIG. 9(*a*) is a plan view of the lens array, FIG. 9(*b*) is a plan view of a light blocking member, and FIG. 9(*c*) is a sectional view table along a line 9(*c*)-9(*c*) in FIG. 9(*a*)
Figure 9B:
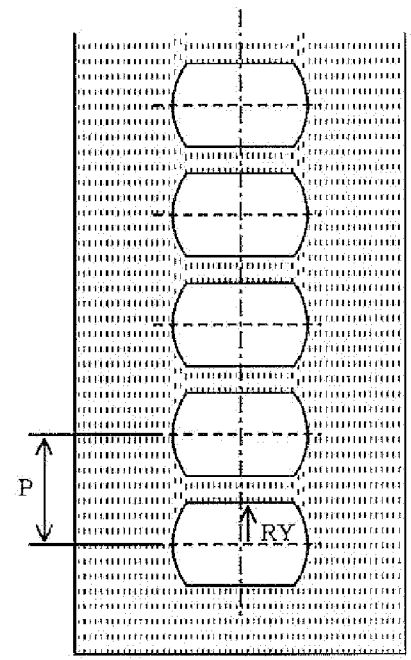
Figure 9C:
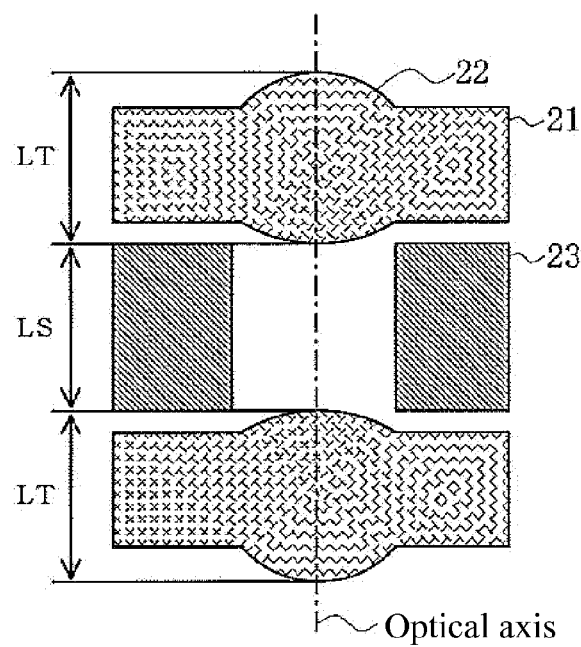

FIGS. 9(a) to 9(c) are schematic views showing the lens array 20 according to the second embodiment of the present invention. More specifically, FIG. 9(a) is a plan view of the lens array 20, FIG. 9(b) is a plan view of the light blocking member 23, and FIG. 9(c) is a sectional view table along a line 9(c)-9(c) in FIG. 9(a).

As shown in FIG. 9(a), the micro lenses 22 are arranged on the lens plate 21 in one row extending in a vertical direction. Further, the micro lenses 22 are arranged with a pitch P, that is, the adjacent micro lenses 22 are arranged such that centers thereof are separated by the pitch P. Further, each of the micro lenses 22 is closely arranged to overlap with the micro lenses 22 on both sides thereof.

In the embodiment, each of the micro lenses 22 has a circular shape with a radius RL in a plane view except portions thereof overlapping with the micro lenses 22 on both sides thereof. Each of the micro lenses 22 is closely arranged to overlap with the micro lenses 22 on both sides thereof, so that double of the radius RL is greater than the distance P (2RL>P). As shown in FIG. 9(c), each of the lens plates 21 has a thickness LT at a thickest portion thereof.

As shown in FIG. 9(b), the light blocking member 23 is a plate member with a band shape extending in a vertical direction and having a thickness LS. The light blocking member 23 includes a plurality of opening portions arranged in one row extending in the vertical direction. The opening portions are arranged with the pitch P, that is, the opening portions are arranged such that centers thereof are separated by the pitch P. Further, the opening portions are arranged such that each of the opening portions does not overlap with the opening portions on both sides thereof in the same row.

In the embodiment, each of the opening portions has a substantially rectangular shape in a plane view having short sides with an arc shape. In the substantially rectangular shape, the center is separated from one of the long sides by a distance RY, i.e., a half distance between the long sides.

As shown in FIG. 9(c), when the lens plate 21 sandwich the light blocking member 23, the opening portions are aligned with the micro lenses 22. More specifically, the optical axis of each of the micro lenses 22, that is, the axis passing through the circular center of each of the micro lenses 22 in a plan view in a thickness direction thereof, is aligned with an axis passing through the center of each of the opening portions in a plan view in a thickness direction thereof.

In the lens array 20 in the embodiment, the light blocking member 23 has the opening portions having the size RA, instead of the size RY in the first embodiment shown in FIG. 3(a) to FIG. 5.

In the embodiment, the micro lens 22 on the side of the object plane may have a configuration the same as that of the micro lens 22 on the side of the image plane. In this case, it is arranged such that the micro lens 22 on the side of the object plane has a curved surface with a configuration the same as that of the micro lens 22 on the side of the image plane. Other configurations are the same as those in the first embodiment, and explanations thereof are omitted.

Figure 10C:
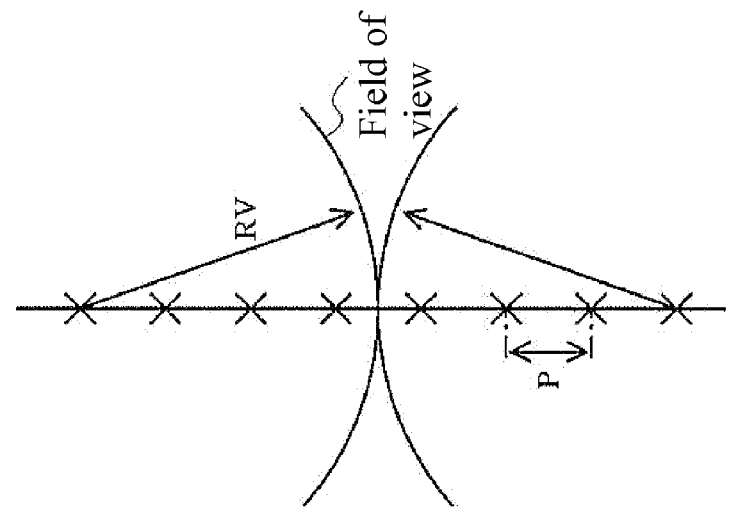
FIGS. 10(*a*) to 10(*c*) are schematic views showing the lens array in which micro lenses are arranged in one row according to the second embodiment of the present invention.
Figure 10B:
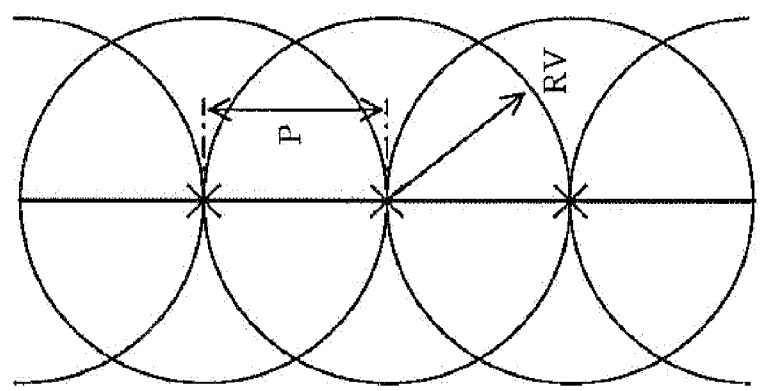
Figure 10A:
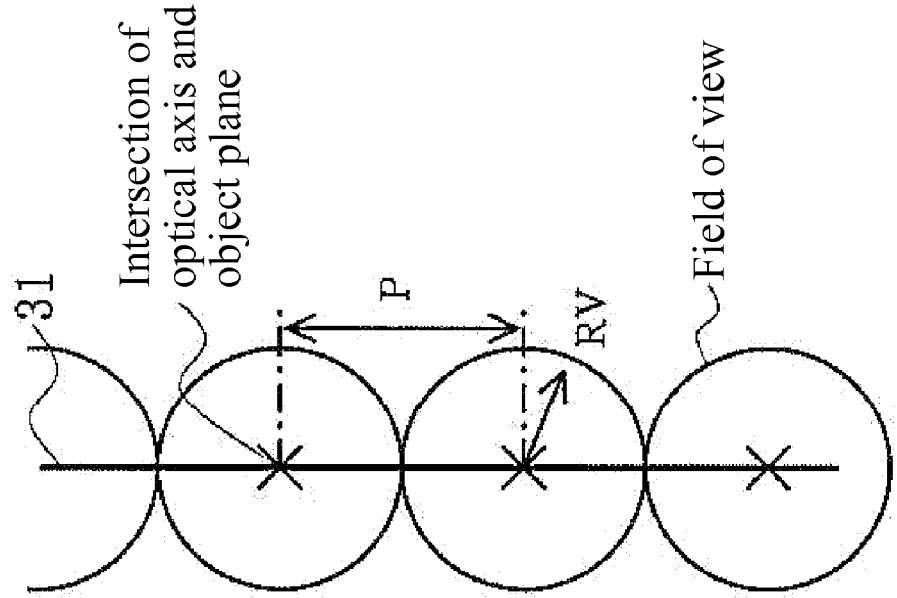

A relationship between an arrangement of the micro lenses 22 and the field of view radius RV when the micro lenses 22 are arranged in the one row will be explained next. FIGS. 10(a) to 10(c) are schematic views showing the lens array 20 in which the micro lenses 22 are arranged in the one row according to the second embodiment of the present invention. More specifically, FIG. 10(a) is a view showing a relationship between the micro lenses 22 and the LED elements 31 when all of the LED elements 31 are situated in a field of view of at least one micro lens 22; FIG. 10(b) is a view showing a relationship between the micro lenses 22 and the LED elements 31 when all of the LED elements 31 are situated in fields of views of two micro lenses 22; and FIG. 10(c) is a view showing a relationship between the micro lenses 22 and the LED elements 31 when all of the LED elements 31 are situated in fields of views of eight micro lenses 22.

FIG. 10(a) is the view showing a condition of the field of view radius RV at a smallest level when all of the LED elements 31 are situated in the field of view of at least one micro lens 22, and images of all of the LED elements 31 are formed on the photosensitive drum 41. That is, under the condition, the field of view radius RV is at the smallest level for the micro lenses 22 to be operable. At the condition, the field of view radius RV of the micro lenses 22 is expressed with the following equation (11):

$$RV = \frac{P}{2} \quad (11)$$

where P is the interval between the micro lenses 22.

In the second embodiment, through replacing RA with RY, the equation (2) represents a relationship among the field of view radius RV, the focal length F of the micro lenses 22, the distance LO between the lens array 20 and the object plane of the lens array 20, and a distance RY between the optical axis of the micro lens 22 and the inner wall of the opening portion of the light blocking member 23 in the arrangement direction of the micro lenses 22.

Accordingly, from the equations (2) and (11), the following equation (12) is obtained as a condition for the lens array 20 to be operable:

$$\frac{P}{2} \leq RY \frac{LO-F}{F} \quad (12)$$

When one micro lens 22 forms an image of each of the LED elements 31, an image of the LED element 31 near the optical axis of the micro lens 22 is different from that of the LED element far from the optical axis of the micro lens 22. Accordingly, it is configured such that at least two of the micro lenses 22 form an image of each of the LED elements 31, thereby making it possible to form images of all of the LED elements 31 in a same shape.

FIG. 10(b) is the view showing a condition for all of the LED elements 31 to be situated in the fields of views of two micro lenses 22. In this case, the field of view radius RV can be expresses with the equation (13) using the interval of the micro lenses 22:

$$RV = P \quad (13)$$

When an object is situated far from the optical axis of the micro lens 22, the micro lens 22 tends to form a distorted image. When the field of view radius RV of the micro lens 22 increases, the micro lens 22 tends to form a distorted image to a larger extent due to a distance of the object from the optical axis thereof. When the LED element 31 is situated in the fields of views of more than eight micro lenses 22, it is found that a resolution is significantly lowered due to the distortion of the image caused by a distance of the object from the optical axis.

FIG. 10(c) is the view showing a condition for all of the LED elements 31 to be situated in the fields of views of more than eight micro lenses 22. At the condition, the field of view radius RV is expressed with the following equation (14) using the interval P of the micro lenses 22:

$$RV = \frac{7}{2}P \quad (14)$$

From the equations (2), (13), and (14), the following equation (15) is obtained as a condition for the lens array 20 to have a high resolution:

$$P \leq RY \frac{LO-F}{F} < \frac{7}{2}P \quad (15)$$

where F is the focal length of the micro lenses 22, LO is the distance between the lens array 20 and the object plane of the lens array 20, and RY is the distance between the optical axis of the micro lens 22 and the inner wall of the opening portion of the light blocking member 23.

An evaluation of the printer 10 with the lens array 20 will be explained next. In the evaluation, a color LED printer having a configuration the same as that of the printer 10 is used, and the color LED printer includes the lens array 20 described above. The color LED printer forms the image having a pattern of dots alternately arranged over an entire printable area shown in FIG. 8. In the evaluation, it is possible to obtain the image with high quality without a streak or an uneven spot.

As described above, in the embodiment, the micro lenses 22 are arranged in the one row in the lens array 20, and may be arranged in a plurality of rows. It is possible to form the lens array 20 with the configuration simpler than that in the first embodiment, and it is still possible to improve a resolution. When the LED head 30 includes the lens array 20, it is possible to obtain the LED head 30 with high contrast and a sufficient exposure amount. Further, when the printer 10 includes the LED head 30, it is possible to accurately form an image on the sheet 11 according to print data without a streak or an uneven spot, thereby improving image quality.

Third Embodiment

A third embodiment of the present invention will be explained next. Components in the third embodiment similar to those in the first and second embodiments are designated with the same reference numerals, and explanations thereof are omitted. Explanations of effects and operations in the third embodiments similar to the first and second embodiments are omitted.

Figure 11:
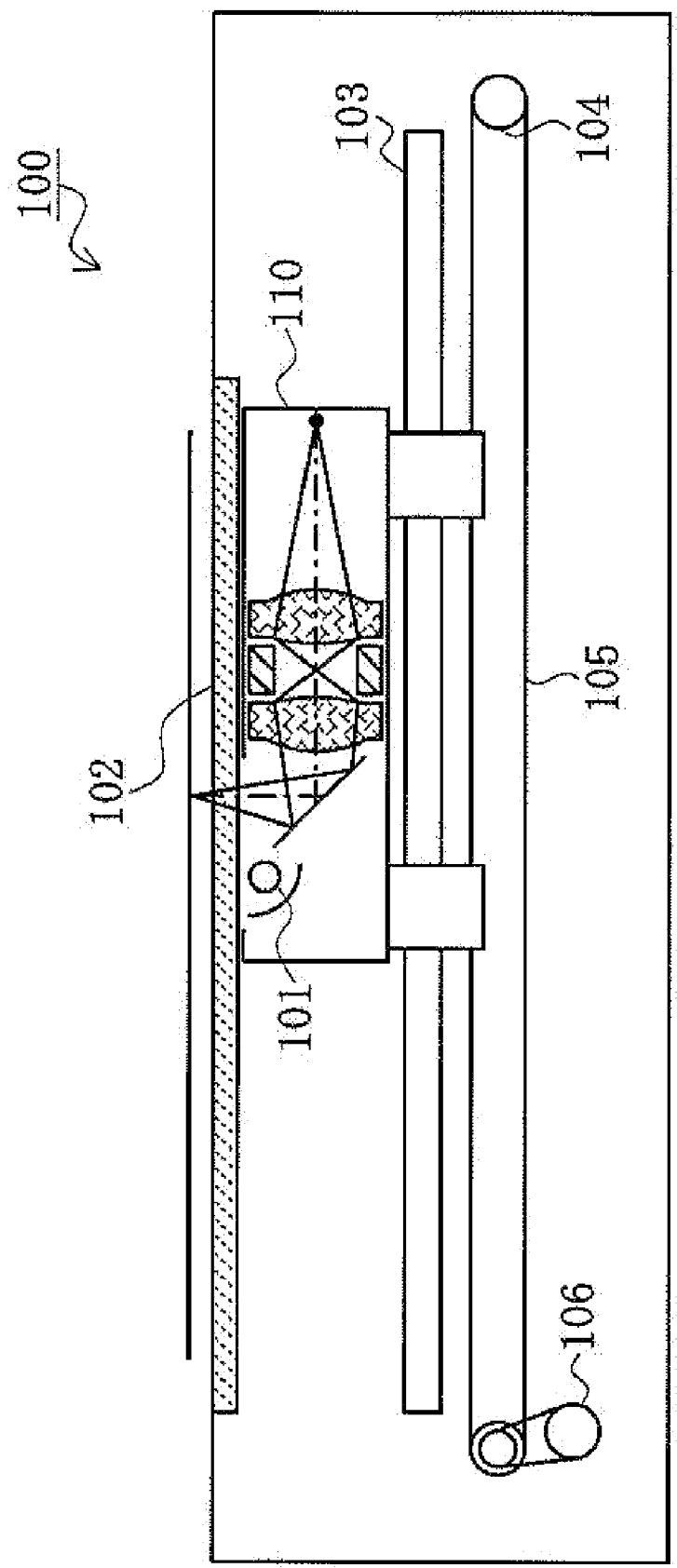
FIG. 11 is a schematic view showing a configuration of a reading apparatus according to a third embodiment of the present invention.

FIG. 11 is a schematic view showing a configuration of a reading apparatus 100 according to the third embodiment of the present invention. The reading apparatus 100 is a scanner for creating electric data of an image to be read.

As shown in FIG. 11, the printer 100 includes a reading head 110 disposed therein to be movable. The reading head 110 includes a sensor such as CCD (Charge Coupled Device), CMOS (Complementary Metal Oxide Semiconductor), and the likes, and an optical element such as the lens array 20. The reading head 110 receives light reflected on a surface of an original, and converts light to electric data. The reading head 110 is disposed to be slidable along a rail 103.

In the embodiment, the printer 100 further includes an original table 102 for placing an original for creating the electric data. The original table 102 is formed of a material transparent relative to visible light. The reading apparatus 100 further includes a lamp 101 as a light source arranged such that light from the lamp 101 reflects on the surface of the original and the sheet 110 receives light.

In the embodiment, the printer 100 further includes a drive belt 105 extended with a plurality of pulleys 104, and a part of the drive belt 105 is connected to a part of the sheet 110. The reading apparatus 100 further includes a motor 106 as a drive source for driving the drive belt 105 to slide the sheet 110.

Figure 12A:
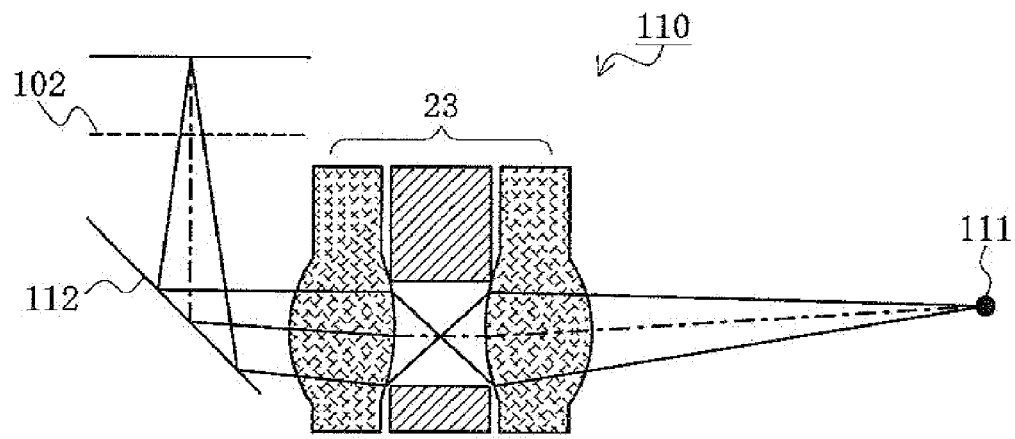
FIGS. 12(*a*) and 12(*b*) are schematic views showing a reading head of the reading apparatus according to the third embodiment of the present invention, wherein FIG. 12(*a*) is a schematic sectional view of the reading head.
FIG. 12(b) is a schematic view of an optical system of the reading head.
Figure 12B:
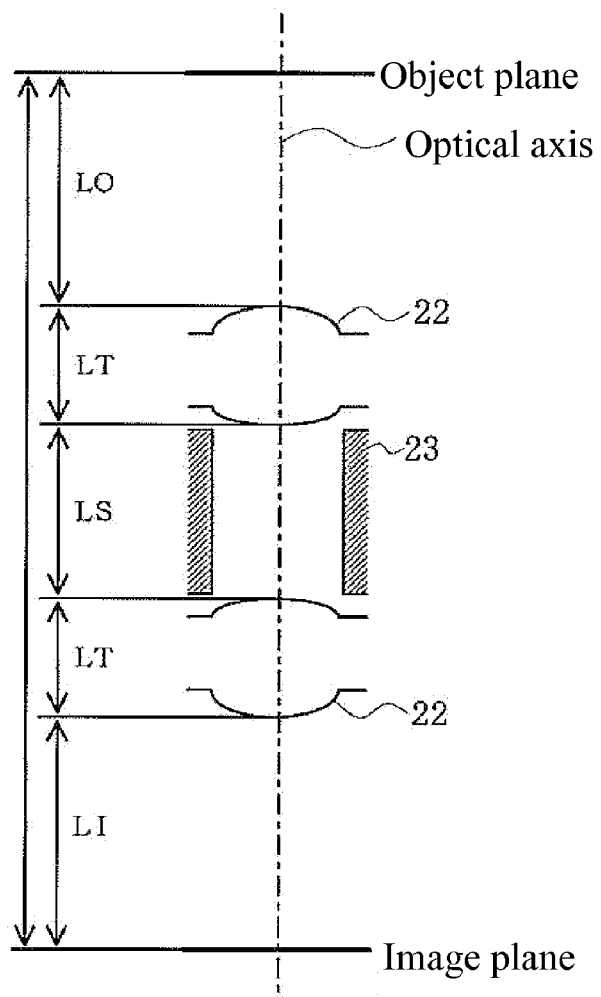

A configuration of the sheet 110 will be explained next. FIGS. 12(a) and 12(b) are schematic views showing the reading head 110 of the reading apparatus 100 according to the third embodiment of the present invention. More specifically, FIG. 12(a) is a schematic sectional view of the sheet 110, and FIG. 12(b) is a schematic view of an optical system of the sheet 110.

As shown in FIG. 12(a), a mirror 112 is provided for bending an optical path of light reflected from the original. In the lens array 20, an image of the original is formed on a light receiving surface of a line sensor 111. The line sensor 111 includes a plurality of light receiving elements arranged linearly for converting the image of the original to an electric signal. The line sensor 111 has a resolution of 600 dpi, that is, 600 of the light receiving elements are arranged per one inch with an interval of 0.0423 mm.

As shown in FIG. 12(b), in the sheet 110, the lens array 20 is arranged at a specific position relative to the object plane (the original) and the image plane (the light receiving surface of the line sensor 111). Note that the lens array 20 has a configuration similar to that in the first and second embodiments, and an explanation thereof is omitted.

An operation of the printer 100 will be explained next. When the lamp 101 is turned on and irradiates the original (refer to FIG. 11), the sheet 110 receives light reflected at the surface of the original. When the motor 106 drives the drive belt 105, the sheet 110 and the lamp 101 move laterally in FIG. 11, so that the sheet 110 receives light reflected from an entire surface of the original.

An operation of the sheet 110 will be explained next. AS shown in FIG. 12(a), light reflected at the surface of the original passes through the original table 102, and the mirror 112 bends the optical path of light, so that the lens array 20 receives light. Accordingly, the lens array 20 forms the image of the original on the line sensor 111, so that the line sensor 11 converts the image of the original to the electrical signal.

An evaluation of the printer 100 with the lens array 20 will be explained next. In the evaluation, a scanner having a configuration the same as that of the printer 100 is used, and scanner includes the lens array 20 described above. The scanner forms the image having a pattern of dots alternately arranged over an entire printable area shown in FIG. 8. In the evaluation, it is possible to obtain the image with high quality.

In the embodiment, the printer 100 is the scanner for converting the optical signal to the electrical signal, and may be a sensor of a switch for converting an optical signal to an electrical signal, or an input/output device, a biometric authentication device, a communication device, a dimension measurement device using the sensor or the switch.

As described above, in the embodiment, it is possible to form an image of an original with high contrast, a large focal length, and sufficient brightness. Further, it is possible to obtain image data identical to that of an original.

Fourth Embodiment

A fourth embodiment of the present invention will be explained next. Components in the fourth embodiment similar to those in the first to third embodiments are designated with the same reference numerals, and explanations thereof are omitted. Explanations of effects and operations in the fourth embodiments similar to the first to third embodiments are omitted.

Figure 13A:
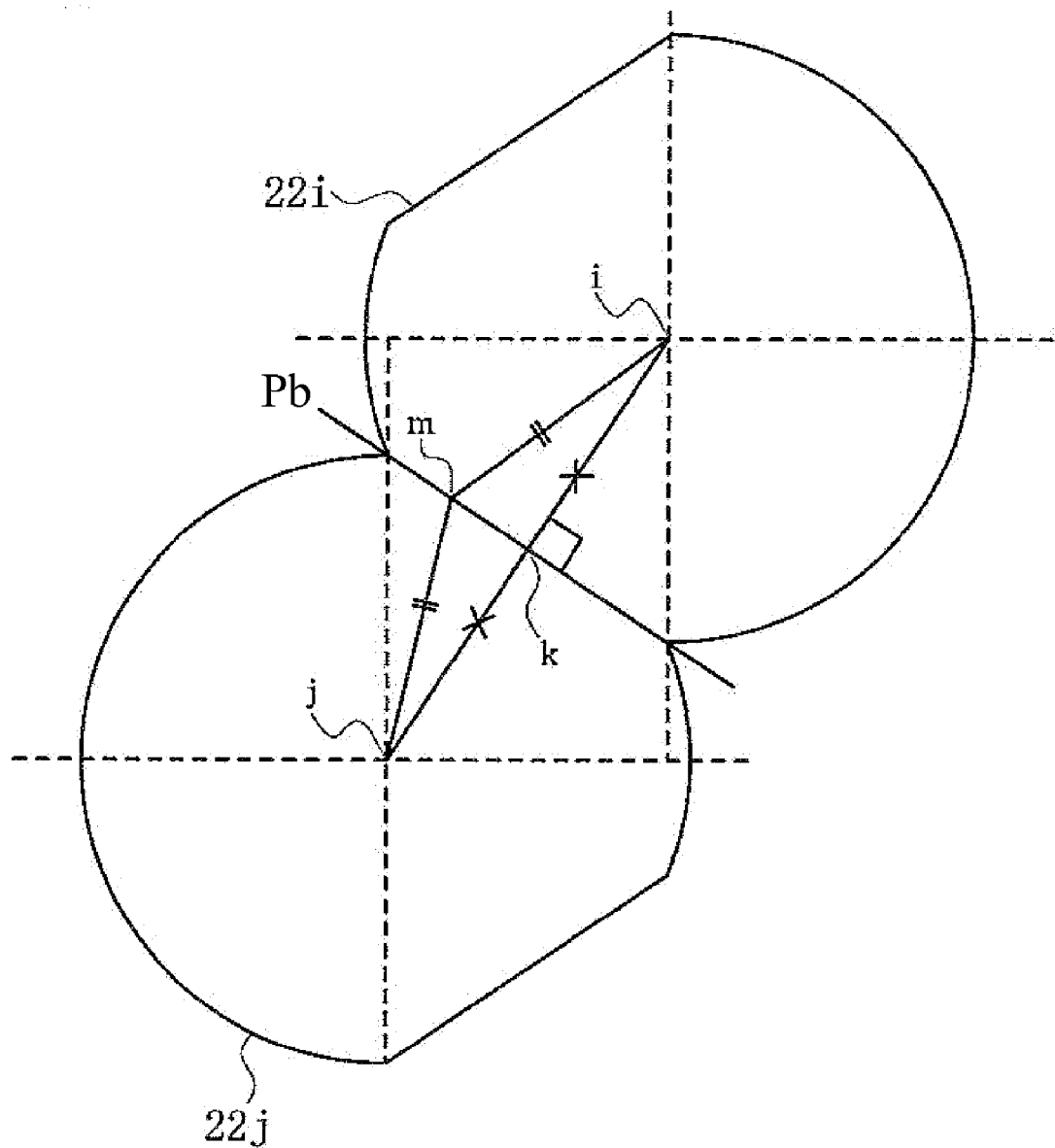
Figure 13B:
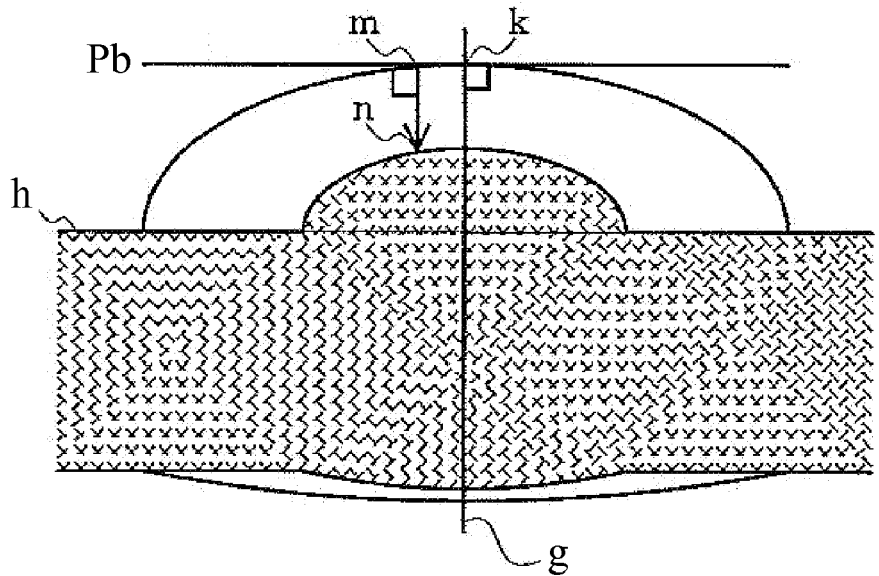
Figure 13C:
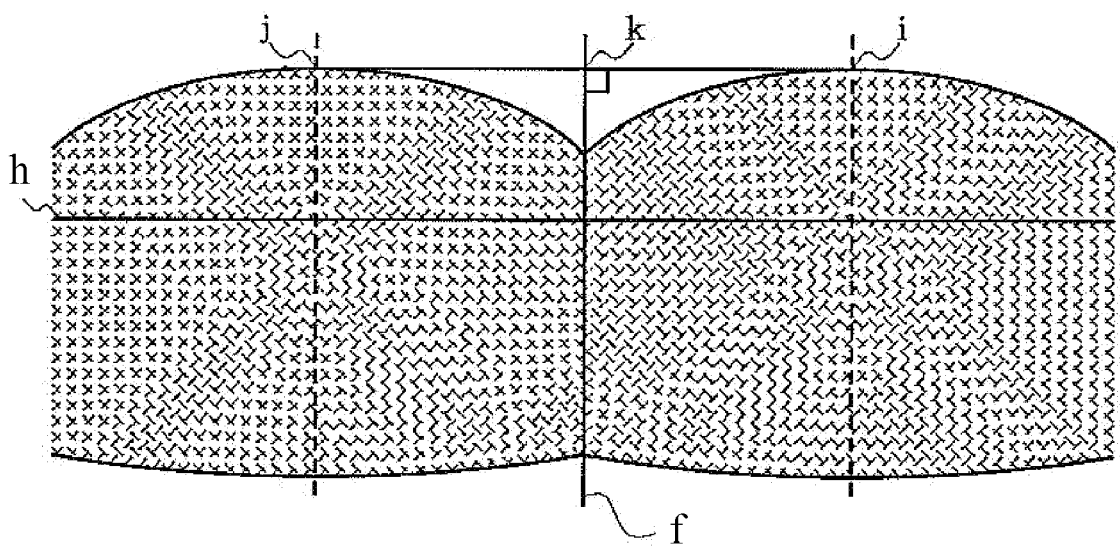

FIGS. 13(a) to 13(c) are schematic views showing the micro lenses 22 of the lens array 20 according to the fourth embodiment of the present invention. More specifically, FIG. 13(a) is a schematic plan view of the micro lenses 22, FIG. 13(b) is a schematic sectional view No. 1 of the micro lenses 22, and FIG. 13(c) is a schematic sectional view No. 2 of the micro lenses 22.

As shown in FIG. 13(a), in the lens array 20, two micro lenses 22, i.e., one micro lens 22i and the other micro lens 22j, are arranged to overlap with each other. The micro lens 22i and the micro lens 22j have curved surfaces with tops i and j. Accordingly, a line k divides a line ij between the tops i and j in half, and a line pb is a perpendicular bisector of the line ij on a plane the same as that of the line ij. Further, a plane f containing the line pb extends in parallel to optical axes of the micro lens 22i and the micro lens 22j. A plane g contains the line ij and the optical axes of the micro lens 22i and the micro lens 22j.

As shown in FIG. 13(b), the micro lens 22i and the micro lens 22j have sections taken along the plane f. An arbitrary point n is defined on a boundary line between the curved surfaces of the micro lens 22i and the micro lens 22j. Further, a cross point m is defined at a crossing between the line pb and a line extending from the point n perpendicular to the line pb. A plane h extends in parallel to the optical axes of the micro lens 22i and the micro lens 22j. As shown in FIG. 13(b), the micro lens 22i and the micro lens 22j further have sections taken along the plane g.

As shown in FIG. 13(a), a triangle ikm shares a line km with a triangle jkm, and the pb is a perpendicular bisector of the line ij. Further, a point k divides the line ij in half, so that a line ik is equal to a line jk. The line km is perpendicular to the line jk, and the line km is perpendicular to the line jk. Accordingly, three sides of the triangle ikm are equal to those of the triangle jkm, and a line im is equal to a line jm.

When the line im has a length Ri, and the line jm has a length Rj, a distance Di between the point m and the point n in the micro lens 22i on the boundary with respect to the micro lens 22j is given by the following equation (16):

$$Di = \frac{\frac{R_i^2}{C}}{1+\sqrt{1-\left(\frac{R_i}{C}\right)^2}} + AR_i^4 + BR_i^6 \quad (16)$$

Further, a distance Dj between the point m and the point n in the micro lens 22*j* on the boundary with respect to the micro lens 22*i* is given by the following equation (17):

$$Dj = \frac{\frac{R_j^2}{C}}{1+\sqrt{1-\left(\frac{R_j}{C}\right)^2}} + AR_j^4 + BR_j^6 \quad (17)$$

Since the length Ri is equal to the length Rj (Ri=Rj), the distance Di is equal to the distance Dj (Di=Dj). Accordingly, the micro lens 22*i* and the micro lens 22*j* have the curved surfaces with a same height in the optical axis direction on the boundary. More specifically, the micro lens 22*i* and the micro lens 22*j* have the curved surfaces with no step in the optical axis direction.

As described above, in the embodiment, the micro lenses 22 have the plane (the plane h) perpendicular to the optical axis and the curved surface taken along the plane (the plane f) containing the perpendicular bisector of the line between the tops of two micro lenses 22 arranged adjacent in parallel to the optical axes thereof. Accordingly, two micro lenses 22 have the curved surface with the same height in the optical axis direction on the boundary and without the step in the optical axis direction.

When the lens array 20 is formed through a resin molding, it is possible to eliminate the step in the direction in parallel to the optical axes of the micro lenses 22. As a result, it is possible to easily flow a resin in a mold, thereby reducing an internal stress of the resin during the molding process. Further, it is possible to improve transferability of the shape during the molding process and accurately form the micro lenses 22.

Further, in the embodiment, there is no step on the boundary of the micro lenses 22 in the direction in parallel to the optical axes of the micro lenses 22. Accordingly, it is possible to prevent a resolution of an exposed image from lowering due to diffuse reflection of light incident on the boundary of the micro lenses 22. Other configurations and operations are similar to those in the first embodiment, and explanations thereof are omitted.

As described above, in the embodiment, it is possible to eliminate the step in the direction in parallel to the optical axes of the micro lenses 22. Accordingly, it is possible to prevent a resolution of an exposed image from lowering due to diffuse reflection of light incident on the boundary of the micro lenses 22.

When the lens array 20 is formed through a resin molding, it is possible to eliminate the step in the direction in parallel to the optical axes of the micro lenses 22. As a result, it is possible to easily flow a resin in a mold, thereby reducing an internal stress of the resin during the molding process. Further, it is possible to improve transferability of the shape during the molding process and accurately form the micro lenses 22.

When the LED head 30 includes the lens array 20 described above, it is possible to obtain a sufficient exposure amount and high contrast. When the printer 10 includes the LED head 30, it is possible to accurately form an image on the sheet 11 according to print data without a streak or an uneven spot, thereby improving image quality.

The disclosure of Japanese Patent Application No. 2008-069777, filed on Mar. 18, 2008, is incorporated in the application by reference.

While the invention has been explained with reference to the specific embodiments of the invention, the explanation is illustrative and the invention is limited only by the appended claims.

What is claimed is:

1. A lens array comprising:
    a plurality of lens assembly members, each of said lens assembly members including a plurality of lenses arranged therein, said lens assembly members being arranged so that an optical axis of each of the lenses of one of the lens assembly members is aligned with an optical axis of each of the lenses of another of the lens assembly members, said lenses of each of the lens assembly members being arranged in at least one row extending in a direction perpendicular to the optical axes; and
    a light blocking member including a plurality of apertures arranged therein, said light blocking member being arranged so that the optical axis of each of the lenses passes through each of the apertures,
    wherein said lens assembly members and said light blocking member are arranged so that the following relationship is satisfied:

$$\frac{P}{2} \leq RY\frac{LO-F}{F}$$

where P is a pitch of the lenses, F is a focal length of each of the lenses, LO is a distance between an object surface and each of the lenses, and RA is a distance between the optical axis and an inner surface of the aperture.

2. The lens array according to claim 1, wherein said lenses in each of the lens assembly members are arranged to satisfy the following relationship:

$$P \leq RY\frac{LO-F}{F} < \frac{7}{2}P$$

3. The lens array according to claim 1, wherein said lenses are arranged so that the pitch P becomes smaller than a double of a distance RL between the optical axis thereof and an outer circumference thereof (PN<2RL).

4. An LED (Light Emitting Diode) head comprising the lens array according to claim 1.

5. An exposure device comprising the lens array according to claim 1.

6. An image forming apparatus comprising the lens array according to claim 1.

7. An image reading apparatus comprising the lens array according to claim 1.

* * * * *